(12) United States Patent
Takahashi

(10) Patent No.: US 11,476,704 B2
(45) Date of Patent: Oct. 18, 2022

(54) POWER SUPPLY CONTROL SYSTEM

(71) Applicant: YAZAKI CORPORATION, Tokyo (JP)

(72) Inventor: Atsushi Takahashi, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/512,650

(22) Filed: Oct. 27, 2021

(65) Prior Publication Data

US 2022/0140647 A1    May 5, 2022

(30) Foreign Application Priority Data

Nov. 2, 2020  (JP) ............................. JP2020-183543

(51) Int. Cl.
   *H02J 9/06*       (2006.01)
   *H03K 17/687*     (2006.01)

(52) U.S. Cl.
   CPC .......... *H02J 9/068* (2020.01); *H03K 17/6871* (2013.01)

(58) Field of Classification Search
   CPC .................. H02J 9/068; H03K 17/6871
   See application file for complete search history.

(56) References Cited

U.S. PATENT DOCUMENTS

| 7,952,488 B1* | 5/2011 | Zansky .................. G01R 31/40 320/136 |
| 2020/0047634 A1* | 2/2020 | Akaishi ................... B60L 58/20 |

FOREIGN PATENT DOCUMENTS

| JP | 2020-24182 A | 2/2020 |
| WO | WO-2020108959 A1 * | 6/2020 |

* cited by examiner

*Primary Examiner* — Metasebia T Retebo
(74) *Attorney, Agent, or Firm* — Kenealy Vaidya LLP

(57) ABSTRACT

A power supply control system controls a redundant power supply system that includes a first power supply system and a second power supply system connected in parallel to a power supply unit. The first power supply system includes a first power supply and a first system. The second power supply system includes a second power supply and a second system. The power supply control system includes a first switch that is a MOSFET provided between the power supply unit and the first power supply, a second switch that is a MOSFET provided between the power supply unit and the second power supply, a wiring configured to supply a dark current flowing from the first power supply to the second system, a first relay of a normally-on type provided on the wiring, and a second relay of a normally-off type provided between the second power supply and the second switch.

6 Claims, 11 Drawing Sheets

POWER SUPPLY CONTROL SYSTEM

CROSS-REFERENCE TO RELATED APPLICATIONS

This application is based on and claims priority under 35 USC 119 from Japanese Patent Application No. 2020-183543 filed on Nov. 2, 2020, the contents of which are incorporated herein by reference.

TECHNICAL FIELD

The present invention relates to a power supply control system.

BACKGROUND ART

A redundant power supply system is known in which a first power supply system that supplies power to a first motion system and a load and a second power supply system that supplies power to a second motion system are connected to a power supply unit via a first DC/DC converter and a second DC/DC converter (for example, see JP-A-2020-24182).

In the redundant power supply system described in JP-A-2020-24182, since the DC/DC converters are provided for a plurality of power supply systems, the entire system is increased in a size and a weight.

Solution to Problem

In view of the above-described circumstances, an object of the present invention is to provide a power supply control system that can reduce a size and a weight of a redundant power supply system and that can secure redundancy of a plurality of power supplies.

Aspect of non-limiting embodiments of the present disclosure relates to provide a power supply control system configured to control a redundant power supply system that includes a first power supply system and a second power supply system connected in parallel to a power supply unit, the first power supply system including a first power supply and a first system to which power is supplied from the first power supply, the second power supply system including a second power supply and a second system to which power is supplied from the second power supply, the power supply control system including: a first switch that is a MOSFET provided between the power supply unit and the first power supply; a second switch that is a MOSFET provided between the power supply unit and the second power supply; a wiring configured to supply a dark current flowing from the first power supply to the second system; a first relay of a normally-on type provided on the wiring; and a second relay of a normally-off type provided between the second power supply and the second switch.

According to the present invention, it is possible to reduce a size and a weight of a redundant power supply system and to secure redundancy of a plurality of power supplies.

DESCRIPTION OF EMBODIMENTS

Hereinafter, the present invention will be described in accordance with preferred embodiments. The present invention is not limited to the embodiments described below, and the embodiments described below can be appropriately modified without departing from the gist of the present invention. Further, in the embodiments described below, although illustration and description of a part of the configuration are omitted, it is needless to say that a known or well-known technology is appropriately applied to details of the omitted technology within a range in which a contradiction does not occur with the contents described below.

Figure 1:
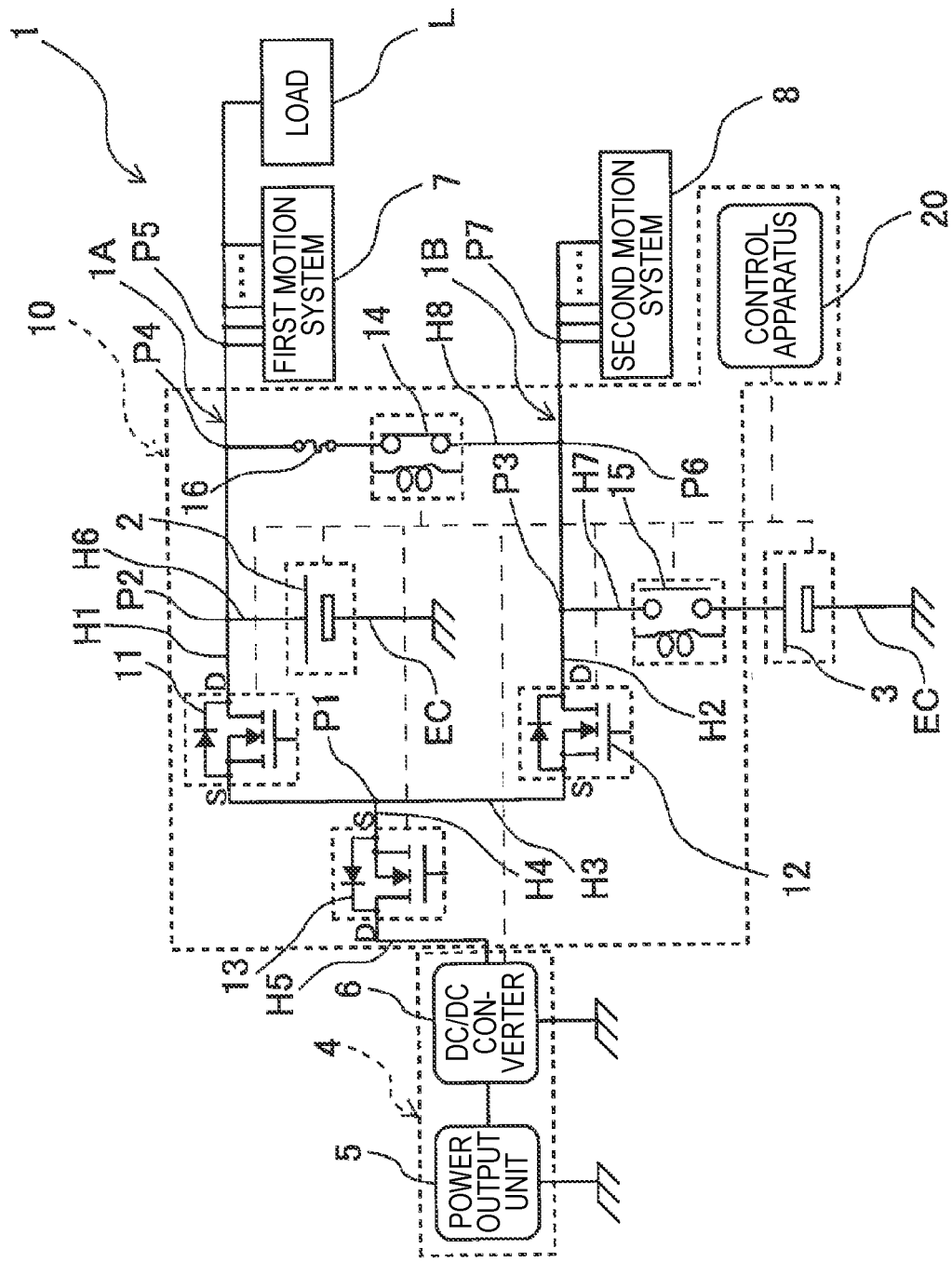
FIG. 1 is a diagram showing an in-vehicle redundant power supply system including a power supply control system according to an embodiment of the present invention.

FIG. 1 is a diagram showing an in-vehicle redundant power supply system 1 including a power supply control system 10 according to an embodiment of the present invention. As shown in FIG. 1, the redundant power supply system 1 includes a first power supply system 1A, a second power supply system 1B, a power supply unit 4, and the power supply control system 10.

The first power supply system 1A includes a first battery 2, a first motion system 7, and a load L. The second power supply system 1B includes a second battery 3 and a second motion system 8. The first battery 2 is a lead-acid battery (lead storage battery) having a rated voltage of 12V. The second battery 3 is a lead-acid battery having a rated voltage of 12V or other secondary batteries having charging and discharging characteristics similar to those of the lead-acid battery. Examples of other secondary batteries can include an assembled battery in which ten nickel-metal hydride batteries are connected in series, an assembled battery in which four iron phosphate type lithium ion batteries are connected in series, and an assembled battery in which five lithium titanate ion batteries are connected in series. Negative terminals of the first battery 2 and the second battery 3 are connected to a body ground via a ground cable EC. When the second battery 3 is an assembled battery, it is preferable to appropriately perform variation correction for correcting variation in a charging state between cells.

The first motion system 7 includes an in-vehicle apparatus related to behavior (traveling, turning, braking, or the like) of a vehicle. The in-vehicle apparatus includes steering, a brake, an autonomous driving assistance apparatus, and the like. The load L includes an in-vehicle apparatus not related to the behavior of the vehicle. The in-vehicle apparatus includes a headlamp, a wiper, and the like. The first motion system 7 and the load L are connected to a positive terminal of the first battery 2 by a first wiring H1 and a sixth wiring H6.

The second motion system 8 redundantly includes an in-vehicle apparatus related to the behavior of the vehicle similar to that of the first motion system 7, The second motion system 8 is connected to a positive terminal of the second battery 3 by a second wiring H2 and a seventh wiring H7.

The power supply unit 4 includes a power output unit 5 and a DC/DC converter 6. The power output unit 5 includes, for example, a high-voltage (HV) power supply of 48V or the like and a generator, and outputs high-voltage power to the DC/DC converter 6. The DC/DC converter 6 steps down the high-voltage power output from the power output unit 5 and outputs the stepped-down high-voltage power to the power supply control system 10.

The power supply control system 10 includes a first switch 11, a second switch 12, a third switch 13, a first relay 14, a second relay 15, a protector 16, and a control apparatus 20. The first switch 11 is connected to a starting end of the first wiring H1. The second switch 12 is connected to a starting end of the second wiring H2.

The first switch 11 and the second switch 12 are N-channel metal-oxide-semiconductor field-effect transistors (MOSFETs). The starting end of the first wiring H1 is connected to a drain D of the first switch 11, and the starting end of the second wiring H2 is connected to a drain D of the second switch 12. A source S of the first switch 11 and a source S of the second switch 12 are connected to each other by a third wiring H3.

The third switch 13 is an N-channel MOSFET. A source S of the third switch 13 is connected to a connection point P1 of the third wiring H3 by a fourth wiring H4. That is, the source S of the third switch 13 is connected to the sources S of the first switch 11 and the second switch 12.

A drain D of the third switch 13 is connected to an output terminal of the DC/DC converter 6 by a fifth wiring H5. That is, the first battery 2, the first motion system 7, and the load L are connected to the output terminal of the DC/DC converter 6 via the first switch 11 and the third switch 13. Further, the second battery 3 and the second motion system 8 are connected to the output terminal of the DC/DC converter 6 via the second switch 12 and the third switch 13.

The positive terminal of the first battery 2 is connected to a connection point P2 of the first wiring H1 by the sixth wiring H6. Further, the positive terminal of the second battery 3 is connected to a connection point P3 of the second wiring H2 by the seventh wiring H7. The second relay 15 is provided in the seventh wiring H7. The second relay 15 is a normally-off type relay, and is turned off when ignition of the vehicle is turned off and is turned on when the ignition of the vehicle is turned on.

Examples of the first relay 14 and the second relay 15 can include a mechanical relay and a semiconductor relay such as a MOSFET as illustrated. When the second relay 15 is the semiconductor relay, the second relay 15 may be provided in the ground cable EC that connects the negative terminal of the second battery 3 and the body ground.

The first wiring H1 and the second wiring H2 are connected by an eighth wiring H8. A connection point P4 between the first wiring H1 and the eighth wiring H8 is disposed between a connection point P5 of the first motion system 7 and the connection point P2 of the first battery 2 in the first wiring H1. Further, a connection point P6 between the second wiring H2 and the eighth wiring H8 is disposed between a connection point P7 of the second motion system 8 and the connection point P3 of the second battery 3 in the second wiring H2.

The first relay 14 and the protector 16 are provided in the eighth wiring H8. The first relay 14 is a normally-on type relay, and is turned on when the ignition of the vehicle is turned off, and is turned off when the ignition of the vehicle is turned on. Here, the eighth wiring H8 is provided for the purpose of supplying a dark current flowing from the first battery 2 to the second motion system 8 when the ignition of the vehicle is turned off. Further, the protector 16 is provided between the first relay 14 and the connection point P4 to protect the first relay 14, and cuts off a dark current that exceeds a normal value. The protector 16 may be provided between the first relay 14 and the connection point P6.

When the ignition of the vehicle is turned on, the first to third switches 11 to 13 are turned on, the first relay 14 is turned off, and the second relay 15 is turned on, so that power is supplied from the power supply unit 4 or the first battery 2 to the first motion system 7 and the load L, and power is supplied from the power supply unit 4 or the second battery 3 to the second motion system 8. On the other hand, when the ignition of the vehicle is turned off, the first to third switches 11 to 13 are turned off, the first relay 14 is turned on, and the second relay 15 is turned off, so that power is supplied from the first battery 2 to the first motion system 7, the load L, and the second motion system 8.

The first switch 11, the second switch 12, and the third switch 13, which are N-channel MOSFETs, cut off a current flowing from the drain D to the source S in an off state. The first switch 11 in an off state cuts off a current flowing from a first battery 2 side. Further, the second switch 12 in an off state cuts off a current flowing from a second battery 3 side. Furthermore, the third switch 13 in an off state cuts off a current flowing from a power supply unit 4 side.

Here, the first switch 11, the second switch 12, and the third switch 13 are in an on state when a gate voltage is applied from a driver (not shown), and a current flows from the drain D to the source S. Further, even in a state where the gate voltage is not applied from the driver, the first switch 11, the second switch 12, and the third switch 13 are in an on state where a current flows from the source S to the drain D when a voltage on a source S side is higher than a voltage on a drain D side. On the other hand, when the gate voltage is not applied from the driver and the voltage on the drain D side is higher than the voltage on the source S side, the first switch 11, the second switch 12, and the third switch 13 are in an off state where a current is cut off from the source S to the drain D. In the following description, a state where the first switch 11, the second switch 12, and the third switch 13 are turned on by application of the gate voltage from the driver is referred to as a forced on state. On the other hand, a state where the first switch 11, the second switch 12, and the third switch 13 are turned on when the gate voltage is not applied from the driver is referred to as an on state. Further, a state where the first switch 11, the second switch 12, and the third switch 13 are turned off when the gate voltage is not applied from the driver is referred to as an off state.

When a voltage of the first switch 11 on a source S side is higher than a voltage of the first switch 11 on a drain D side, the first switch 11 is in the on state, and a current flows from the power supply unit 4 side to a first power supply system 1A side. On the other hand, when the voltage of the first switch 11 on the drain D side is higher than the voltage of the first switch 11 on the source S side, the first switch 11 is in the off state to cut off a current flowing from the power supply unit 4 side.

When a voltage of the second switch 12 on a source S side is higher than a voltage of the second switch 12 on a drain D side, the second switch 12 is in the on state, and a current flows from the power supply unit 4 side to a second power supply system 1B side. On the other hand, when a voltage of the second switch 12 on the drain D side is higher than a voltage of the second switch 12 on the source S side, the second switch 12 is in the off state to cut off a current flowing from the power supply unit 4 side.

When a voltage of the third switch 13 on a source S side is higher than a voltage of the third switch 13 on a drain D side, the third switch 13 is in the on state, and a current flows from the first power supply system 1A side and the second power supply system 1B side to the power supply unit 4 side. On the other hand, when a voltage of the third switch 13 on the drain D side is higher than a voltage of the third switch 13 on the source S side, the third switch 13 is in the off state to cut off a current flowing from the first power supply system 1A side and the second power supply system 1B side.

The control apparatus 20 includes a driver (not shown) and a micro processing unit (MPU). The driver is a gate drive circuit including a resistor, a capacitor, and the like, and switches a gate drive voltage applied to the first switch 11, the second switch 12, and the third switch 13 to a voltage that can be set in the forced on state or a voltage that can be set in the on state and the off state in response to a control signal output from the MPU.

The MPU outputs, to the driver, a control signal for switching the forced on state/on or off state of the first switch 11, the second switch 12, and the third switch 13 in accordance with an on/off instruction from an in-vehicle electronic control unit (ECU, not shown). Further, the MPU executes control for switching on/off of the first relay 14, the second relay 15, and the DC/DC converter 6.

Figure 2:
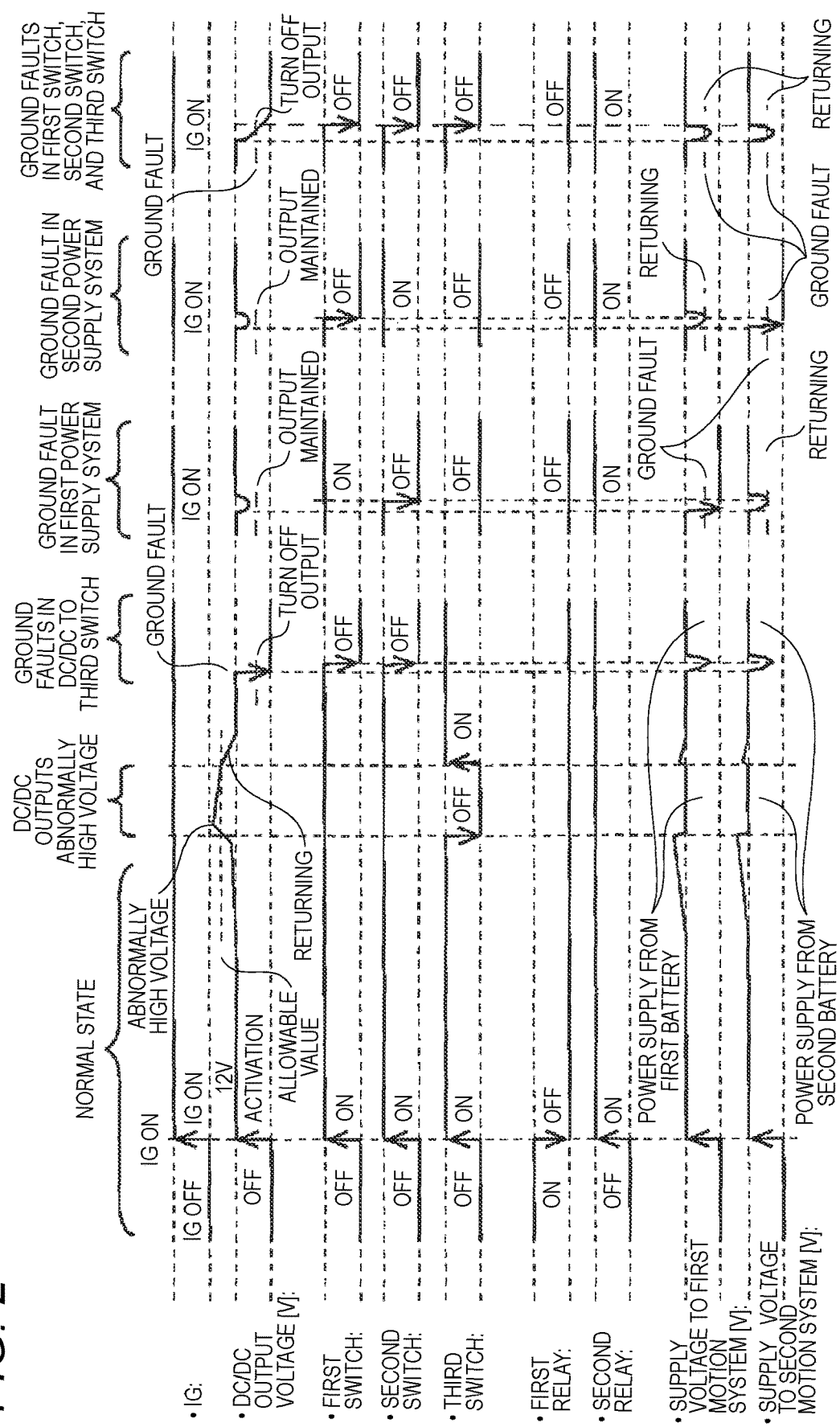
FIG. 2 is a timing chart showing a processing of the power supply control system shown in FIG. 1.
Figure 3:
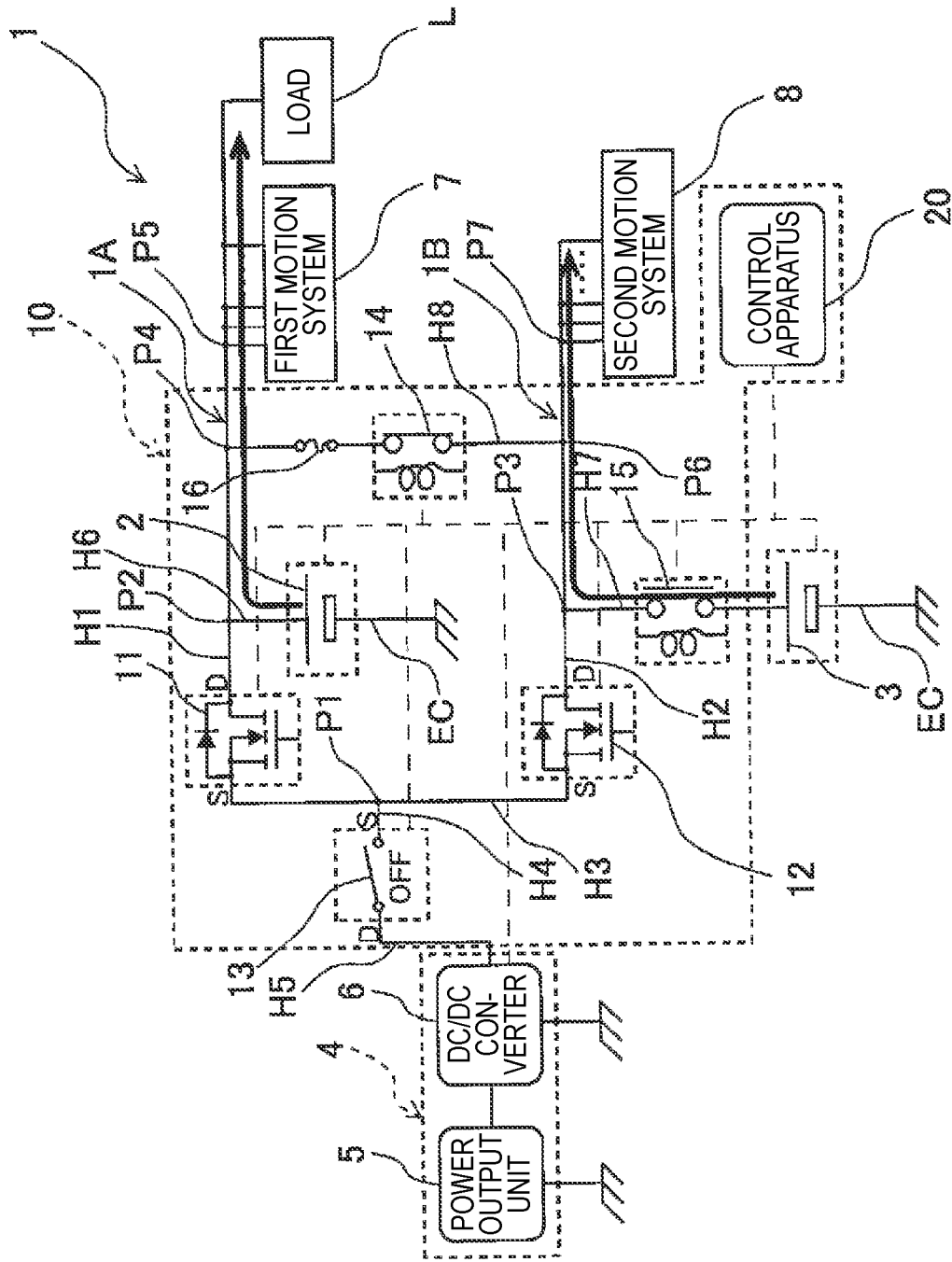
FIG. 3 is a diagram showing functions of the power supply control system shown in FIG. 1.
Figure 4:
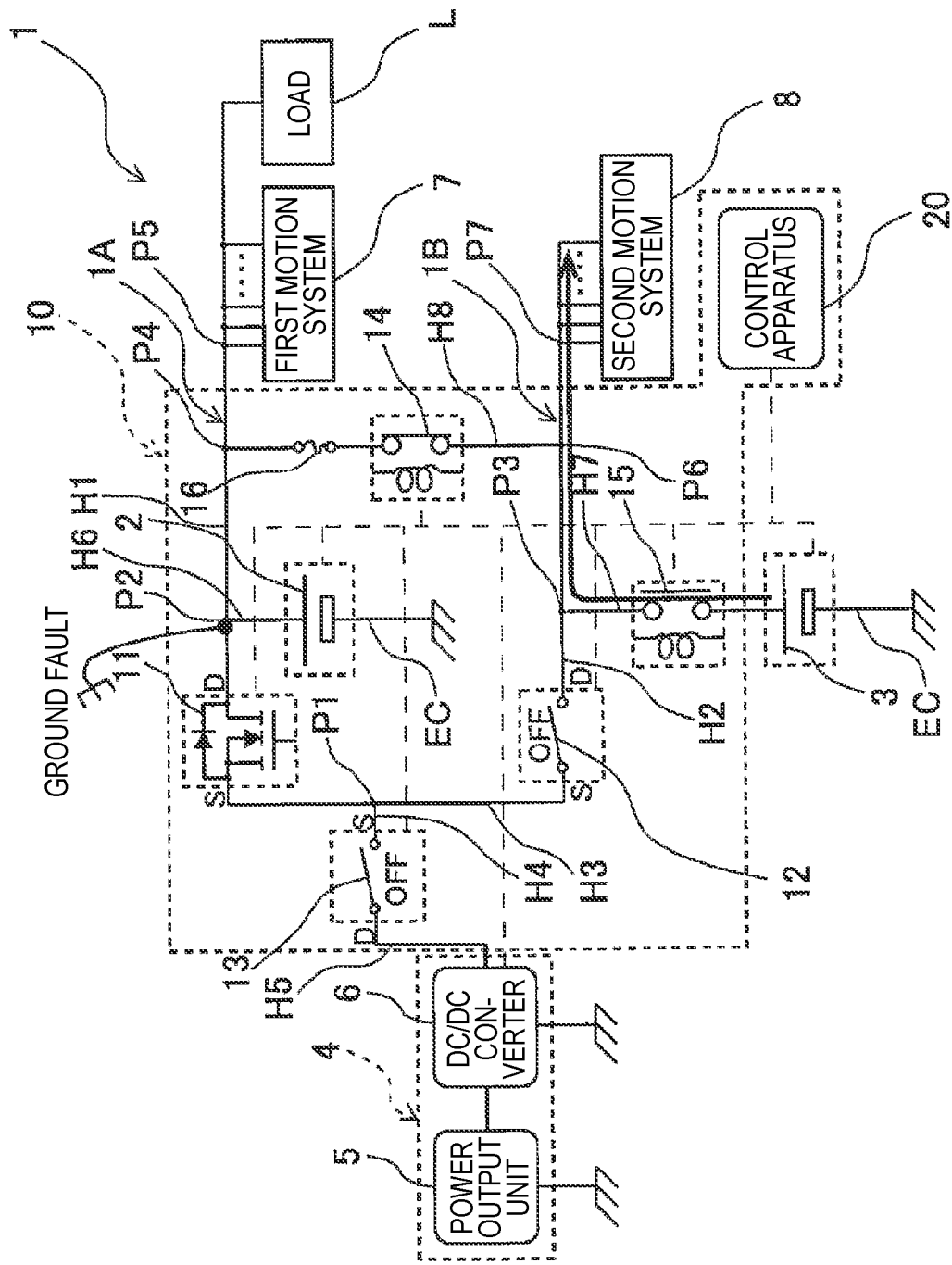
FIG. 4 is a diagram showing functions of the power supply control system shown in FIG. 1.
Figure 5:
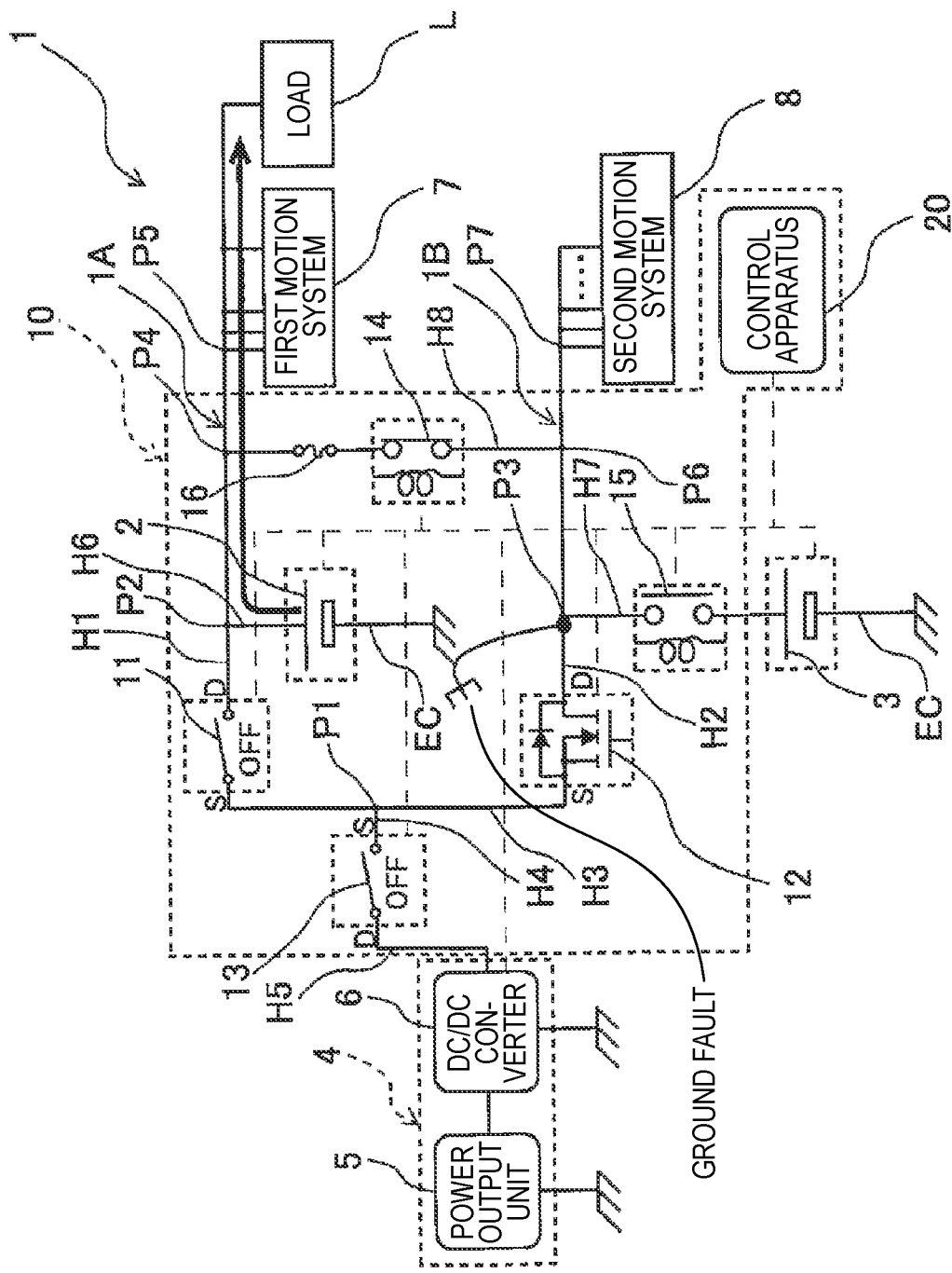
FIG. 5 is a diagram showing functions of the power supply control system shown in FIG. 1.

FIG. 2 is a timing chart showing a processing of the power supply control system 10 shown in FIG. 1. Further, FIGS. 3 to 5 are diagrams showing functions of the power supply control system 10 shown in FIG. 1. As shown in the timing chart of FIG. 2, when ignition (IG) is turned off, an output of the DC/DC converter 6 is off, the first to third switches 11 to 13 are in the off state, the first relay 14 is in the on state, and the second relay 15 is in the off state. When the ignition is turned off, the first switch 11 in the off state cuts off a current flowing from the first battery 2 side, the second switch 12 in the off state cuts off a current flowing from the second battery 3 side, and the second relay 15 cuts off a current flowing from the second battery 3 side. Accordingly, when the ignition is turned off, the dark current is supplied from the first battery 2 to the first motion system 7, the load L, and the second motion system 8, but the dark current is not supplied from the second battery 3 to the first motion system 7, the load L, and the second motion system 8.

When the ignition is turned on, an output of the DC/DC converter 6 increases to a predetermined value (for example, 12V of a nominal voltage), the first to third switches 11 to 13 are in the forced on state, the first relay 14 is in the off state, and the second relay 15 is in the on state. When the ignition is turned on, the first to third switches 11 to 13 in the forced on state allow a current to flow in both directions as long as there is no voltage drop due to a ground fault or the like. Accordingly, when the ignition is turned on, the first battery 2 and the second battery 3 are charged by a power supply from the DC/DC converter 6, power is supplied from the DC/DC converter 6 or the first battery 2 to the first motion system 7 and the load L, and power is supplied from the DC/DC converter 6 or the second battery 3 to the second motion system 8. Normally, a state after the ignition is turned on is maintained.

Here, since charging characteristics of the first battery 2 and the second battery 3 are similar to each other, the first battery 2 and the second battery 3 are in a similar charging state by supplying power of the same voltage from the common DC/DC converter 6. When a variation in a charging state between the first battery 2 and the second battery 3 is large, a current flows from one battery to the other battery, which complicates charging control.

The control apparatus 20 detects a voltage between the DC/DC converter 6 and the third switch 13. When the voltage becomes an abnormally high voltage that exceeds an allowable value, the control apparatus 20 sets the third switch 13 in the off state. Accordingly, the third switch 13 in the off state cuts off a current flowing from the drain D to the source S, that is, a current flowing from a DC/DC converter 6 side. As shown in FIG. 3, power of nominal 12V is supplied from the first battery 2 to the first motion system 7 and the load L, and the power of the nominal 12V is supplied from the second battery 3 to the second motion system 8.

As shown in the timing chart of FIG. 2, when a ground fault occurs between the DC/DC converter 6 and the third switch 13, a voltage between the DC/DC converter 6 and the third switch 13 decreases to or below a predetermined value (for example, 6V) lower than the nominal 12V. When the voltage between the DC/DC converter 6 and the third switch 13 decreases to or below the predetermined value lower than the nominal voltage 12V, the control apparatus 20 turns off an output of the DC/DC converter 6 and sets the first switch 11 and the second switch 12 in the off state. Accordingly, a supply voltage from the first battery 2 to the first motion system 7 and the load L instantaneously decreases and then returns to the nominal 12V, and normal operations of the first motion system 7 and the load L are maintained. Further, a supply voltage from the second battery 3 to the second motion system 8 instantaneously decreases and then returns to the nominal 12V, and a normal operation of the second motion system 8 is maintained.

Instead of detecting a ground fault that occurs between the DC/DC converter 6 and the third switch 13 in accordance with a voltage between the DC/DC converter 6 and the third switch 13, the ground fault that occurs between the DC/DC converter 6 and the third switch 13 may be detected in accordance with a current value of a current that flows from the first battery 2 and the second battery 3 to the first to third switches 11 to 13. When a ground fault occurs between the DC/DC converter 6 and the third switch 13, an excessive current flows from the first battery 2 and the second battery 3 to the first to third switches 11 to 13. Therefore, when an excessive current value that exceeds an allowable value is detected, the first switch 11 and the second switch 12 may be in the off state.

When a ground fault occurs in the first power supply system 1A, a voltage of the first power supply system 1A decreases to or below a predetermined value (for example, 6V) lower than the nominal 12V. When the voltage of the first power supply system 1A decreases to or below the predetermined value lower than the nominal voltage 12V, the control apparatus 20 sets the second switch 12 and the third switch 13 in the off state. The second switch 12 in the off state cuts off a current flowing from the drain D to the source S, that is, a current flowing from the second battery 3 side. Here, since the first relay 14 is in the off state, the second power supply system 1B is disconnected from the first power supply, system 1A where the ground fault occurs. Accordingly, as shown in FIG. 4, a power supply from the DC/DC converter 6 or the first battery 2 to the first motion system 7 is stopped, and a power supply from the second battery 3 to the second motion system 8 is started, so that the second motion system 8 operates normally.

When a ground fault occurs in the first power supply system 1A, the third switch 13 in the off state cuts off a current flowing from the drain D to the source S, that is, a current flowing from the DC/DC converter 6 to a ground fault point of the first power supply system 1A. Accordingly, the DC/DC converter 6 is protected. Instead of detecting the ground fault that occurs in the first power supply system 1A in accordance with a voltage of the first power supply system 1A, the ground fault that occurs in the first power supply system 1A may be detected in accordance with a current value of a current that flows from the second battery 3 to the second switch 12. When the ground fault occurs in the first power supply system 1A, an excessive current flows from the second battery 3 to the second switch 12. Therefore, when an excessive current value that exceeds an allowable value is detected, the second switch 12 may be in the off state.

As shown in the timing chart of FIG. 2, when a ground fault occurs in the second power supply system 1B, a voltage of the second power supply system 1B decreases to or below a predetermined value (for example, 6V) lower than the nominal 12V. When the voltage of the second power supply system 1B decreases to or below the predetermined value lower than the nominal voltage 12V, the control apparatus 20 sets the first switch 11 and the third switch 13 in the off state. The first switch 11 in the off state cuts off a current flowing from the drain D to the source S, that is, a current flowing from the first battery 2 side. Here, since the first relay 14 is turned off, the first power supply system 1A is disconnected from the second power supply system 1B where the ground fault occurs. Accordingly, as shown in FIG. 5, a power supply from the DC/DC converter 6 or the second battery 3 to the second motion system 8 is stopped, and a power supply from the first battery 2 to the first motion system 7 and the load L is started, so that the first motion system 7 and the load L operate normally.

When a ground fault occurs in the second power supply system 1B, the third switch 13 in the off state cuts off a current flowing from the drain D to the source S, that is, a current flowing from the DC/DC converter 6 to a ground fault point of the second power supply system 1B. Accordingly, the DC/DC converter 6 is protected. Instead of detecting the ground fault that occurs in the second power supply system 1B in accordance with a voltage of the second power supply system 1B, the ground fault that occurs in the second power supply system 1B may be detected in accordance with a current value of a current that flows from the first battery 2 to the first switch 11. When the ground fault occurs in the second power supply system 1B, an excessive current flows from the first battery 2 to the first switch 11. Therefore, when an excessive current value that exceeds an allowable value is detected, the first switch 11 may be in the off state.

As shown in the timing chart of FIG. 2, when a ground fault occurs between the first switch 11 as well as the second switch 12 and the third switch 13, a voltage between the first switch 11 as well as the second switch 12 and the third switch 13 decreases to or below the predetermined value (for example, 6V) lower than the nominal 12V. When the voltage between the first switch 11 as well as the second switch 12 and the third switch 13 decreases to or below the predetermined value lower than the nominal voltage 12V, the control apparatus 20 sets the first to third switches 11 to 13 in the off state and turns off an output from the DC/DC converter 6. Accordingly, a supply voltage from the first battery 2 to the first motion system 7 and the load L instantaneously decreases and then returns to the nominal 12V, and normal operations of the first motion system 7 and the load L are maintained. Further, a supply voltage from the second battery 3 to the second motion system 8 instantaneously decreases and then returns to the nominal 12V, and a normal operation of the second motion system 8 is maintained.

Instead of detecting a ground fault that occurs between the first switch 11 as well as the second switch 12 and the third switch 13 in accordance with the voltage between the first switch 11 as well as the second switch 12 and the third switch 13, the ground fault that occurs between the first switch 11 as well as the second switch 12 and the third switch 13 may be detected in accordance with a current value of a current that flows among the first switch 11, the second switch 12, and the third switch 13 from the first to third switches 11 to 13. When the ground fault occurs between the first switch 11 as well as the second switch 12 and the third switch 13, an excessive current flows among the first switch 11, the second switch 12, and the third switch 13 from the first to third switches 11 to 13. Therefore, when an excessive current value that exceeds an allowable value is detected, the first to third switches 11 to 13 may be in the off state.

The control apparatus 20 switches on/off of the second relay 15 in accordance with a charging and discharging state of the second battery 3. For example, when the second battery 3 shifts to an overcharged state, when the second battery 3 is discharged with a large current that exceeds an allowable value, when the second battery 3 shifts to an over-discharged state where the second battery 3 falls below a lower limit value of a charging capacity, and when a temperature of the second battery 3 is a high temperature that exceeds an allowable value, the control apparatus 20 sets the second relay 15 in the off state. At this time, redundancy of the power supply is lost. Therefore, when the second relay 15 is set in the off state, the control apparatus 20 notifies a control device that is supplied with power from the second battery 3 and executes a redundant operation of an abnormality of the second battery 3.

In the present embodiment, since the first battery 2 is a lead-acid battery, a relay for protection such as overcharging of the first battery 2 is not provided. However, when the first battery 2 is a secondary battery other than the lead-acid battery similarly to the second battery 3, it is preferable to provide a relay for protecting the first battery 2 in the sixth wiring H6.

As described above, according to the power supply control system 10 of the present embodiment, in the redundant power supply system 1 in which power is supplied from one DC/DC converter 6 to the first power supply system 1A and the second power supply system 1B, even when a failure such as a ground fault occurs in any one of the first power supply system 1A and the second power supply system 1B, the other power supply system can be operated normally. Further, when an output voltage of the DC/DC converter 6 increases abnormally or when a failure such as a ground fault occurs between the DC/DC converter 6 and the first switch 11 as well as the second switch 12, the first power supply system 1A and the second power supply system 1B can be operated normally by supplying power from the first battery 2 to the first motion system 7 and the load L and supplying power from the second battery 3 to the second motion system 8. Therefore, by providing one DC/DC converter 6, the redundant power supply system 1 can be reduced in a size and a weight, and redundancy of a plurality of power supplies can be secured.

When ignition is turned off, discharging from the second battery 3 is stopped by the second relay 15 of the normally-off type, and then a dark current can be supplied from the first battery 2 to the second motion system 8 through the first relay 14 of a normally-on type. Further, when the ignition is turned on, since the first relay 14 is in the off state and the second relay 15 is in the on state, the first power supply system 1A and the second power supply system 1B can be disconnected from each other by switching on/off of the first switch 11 and the second switch 12. Accordingly, when a failure such as a ground fault occurs in any one of the first power supply system 1A and the second power supply system 1B, one power supply system can be disconnected from the other power supply system where the failure occurs and can be operated normally.

Figure 6:
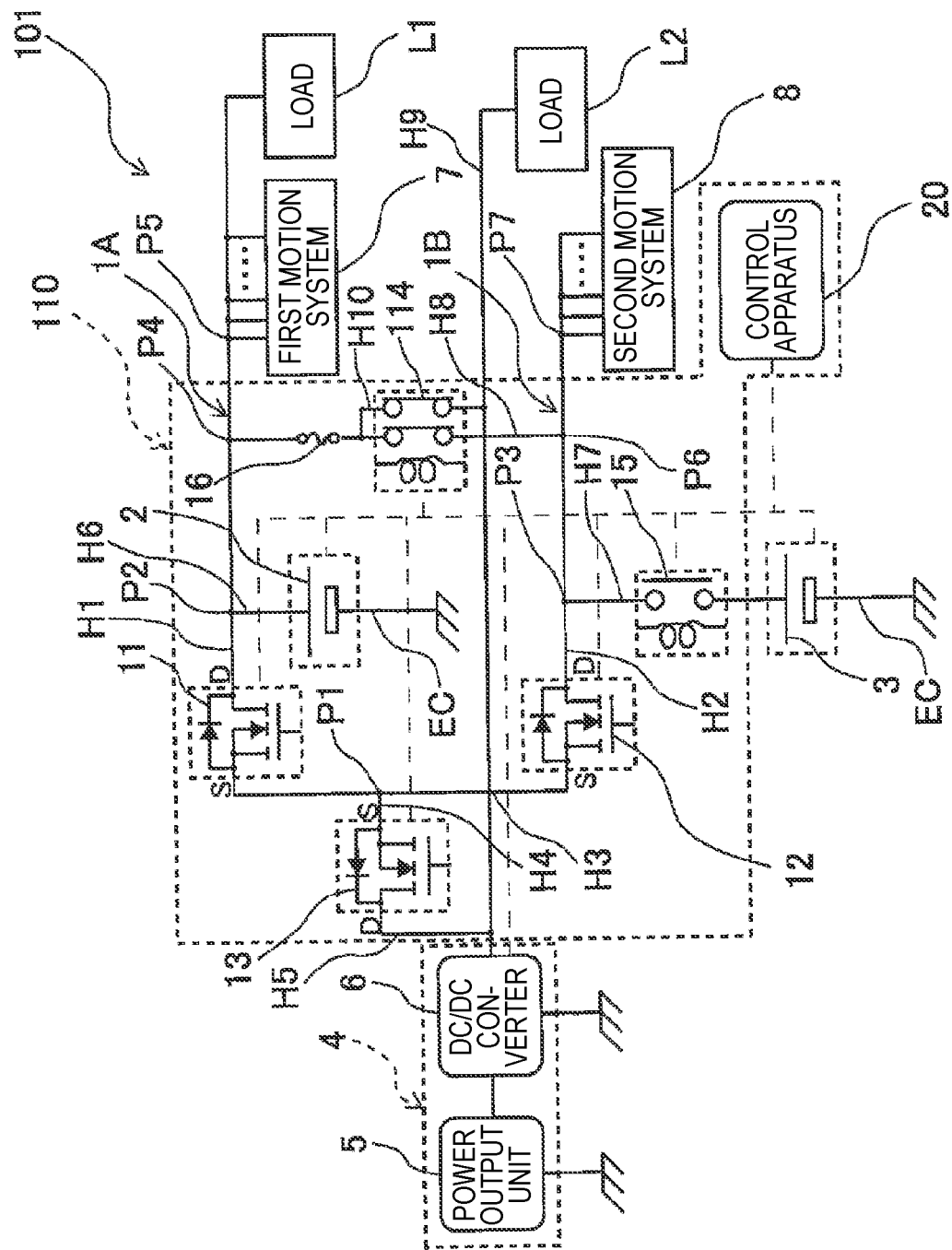
FIG. 6 is a diagram showing an in-vehicle redundant power supply system including a power supply control system according to another embodiment of the present invention.

FIG. 6 is a diagram showing an in-vehicle redundant power supply system 101 including a power supply control system 110 according to another embodiment of the present invention. The same reference numerals are given to configurations similar to those of the above-described embodiment, and description of the above-described embodiments is incorporated.

As shown in FIG. 6, the redundant power supply system 101 includes a load L2 connected to an output terminal of the DC/DC converter 6 by a ninth wiring H9 in addition to the load L1 provided in the first power supply system 1A. The load L2 is a load directly supplied with power from the DC/DC converter 6 and is not provided in the redundant configuration.

The power supply control system 110 includes a first relay 114 having two poles instead of the first relay 14 having one pole. The first relay 114 is provided so as to straddle the eighth wiring H8 that connects the first wiring H1 and the second wiring H2 and a tenth wiring H10 that connects the eighth wiring H8 and the ninth wiring H9. When ignition is turned off, power is supplied from the first battery 2 to the second motion system 8 and the load L2 through the first relay 114.

Here, by making the load L2 a separate system from the second power supply system 1B, a value of a current that flows through the second switch 12 can be reduced, and a size of the second switch 12 can be reduced.

Figure 7:
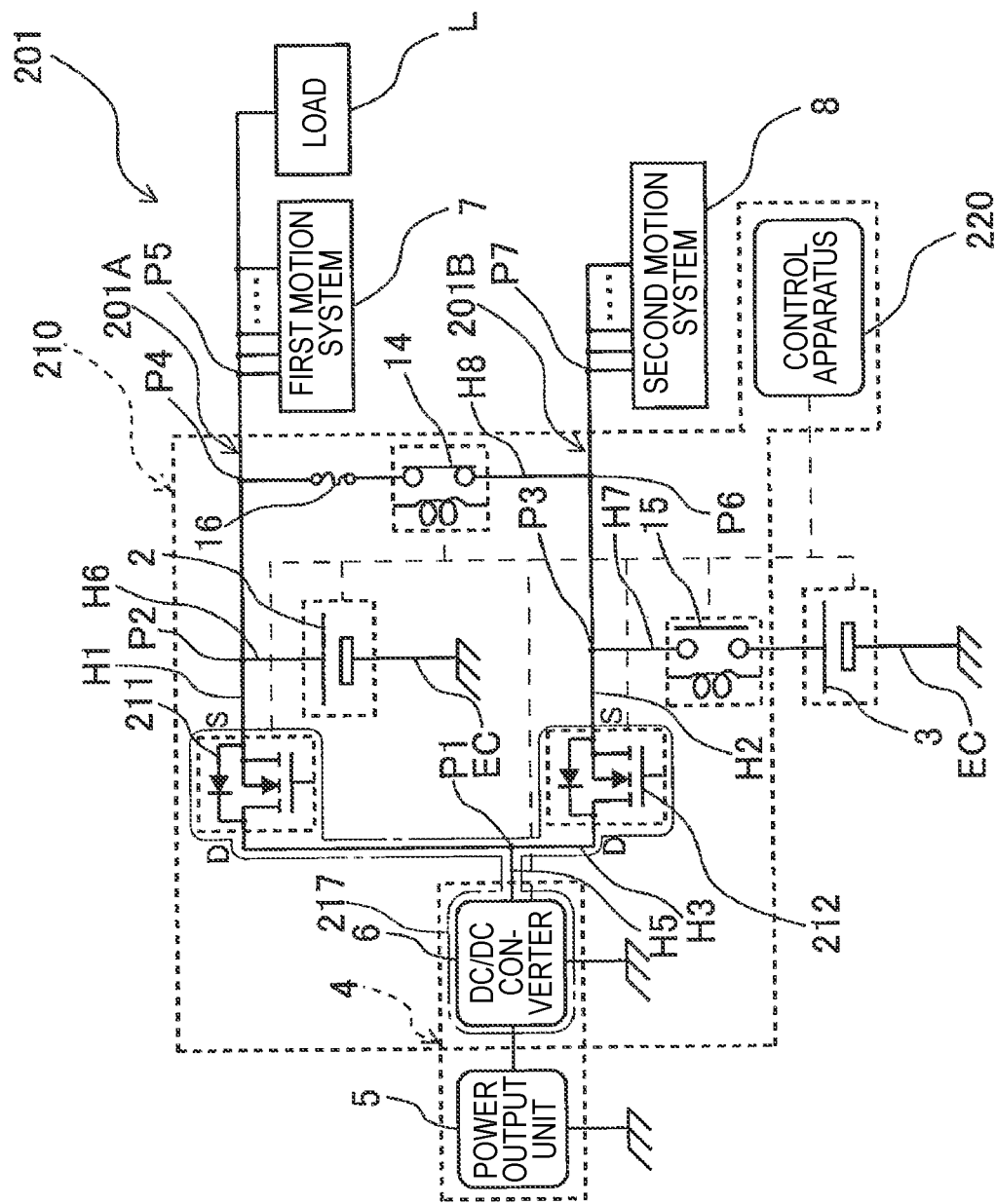
FIG. 7 is a diagram showing an in-vehicle redundant power supply system including a power supply control system according to another embodiment of the present invention.

FIG. 7 is a diagram showing an in-vehicle redundant power supply system 201 including a power supply control system 210 according to another embodiment of the present invention. The same reference numerals are given to configurations similar to those of the above-described embodiment, and description of the above-described embodiments is incorporated.

As shown in FIG. 7, the redundant power supply system 201 includes a first power supply system 201A, a second power supply system 201B, the power supply unit 4, and the power supply control system 210. The first power supply system 201A includes the first battery 2, the first motion system 7, and the load L. The second power supply system 201B includes the second battery 3 and the second motion system 8.

The power supply control system 210 includes a first switch 211, a second switch 212, the first relay 14, the second relay 15, the protector 16, a housing 217, and a control apparatus 220. The first switch 211 is connected to a starting end of the first wiring H1. The second switch 212 is connected to a starting end of the second wiring H2.

The first switch 211 and the second switch 212 are N-channel MOSFETs. The starting end of the first wiring H1 is connected to a source S of the first switch 211, and the starting end of the second wiring H2 is connected to a source S of the second switch 212. A drain D of the first switch 211 and a drain D of the second switch 212 are connected to each other by the third wiring H3.

The connection point P1 of the third wiring H3 and the output terminal of the DC/DC converter 6 are connected by the fifth wiring H5. That is, the first battery 2, the first motion system 7, and the load L are connected to the output terminal of the DC/DC converter 6 via the first switch 211. Further, the second battery 3 and the second motion system 8 are connected to the output terminal of the DC/DC converter 6 via the second switch 212.

The first switch 211 and the second switch 212, which are N-channel MOSFETs cut off a current flowing from the drain D to the source S in an off state. The first switch 211 and the second switch 212 in the off state cut off a current flowing from a DC/DC converter 6 side.

Here, the first switch 211 and the second switch 212 are in an on state when a gate voltage is applied from a driver (not shown), and a current flows from the drain D to the source S. Further, even in a state where the gate voltage is not applied from the driver, the first switch 211 and the second switch 212 are in an on state where a current flows from the source S to the drain D when a voltage on a source S side is higher than a voltage on a drain D side. On the other hand, when the gate voltage is not applied from the driver and the voltage on the drain D side is higher than the voltage on the source S side, the first switch 211 and the second switch 212 are in an off state where the current flowing from the source S to the drain D is cut off. In the following description, a state where the first switch 211 and the second switch 212 are turned on by application of the gate voltage from the driver is referred to as a forced on state. On the other hand, a state where the first switch 211 and the second switch 212 are turned on when the gate voltage is not applied from the driver is referred to as an on state. Further, a state where the first switch 211 and the second switch 212 are turned off when the gate voltage is not applied from the driver is referred to as an off state.

When a voltage of the first switch 211 on a source S side is higher than a voltage of the first switch 211 on a drain D side, the first switch 211 is in the on state, and a current flows from a first battery 2 side to the DC/DC converter 6 side. On the other hand, when the voltage of the first switch 211 on the drain D side is higher than the voltage of the first switch 211 on the source S side, the first switch 211 is in the off state to cut off a current flowing from the first battery 2 side.

When a voltage of the second switch 212 on a source S side is higher than a voltage of the second switch 212 on a drain D side, the second switch 212 is in the on state, and a current flows from a second battery 3 side to the DC/DC converter 6 side. On the other hand, when the voltage of the second switch 212 on the drain D side is higher than the voltage of the second switch 212 on the source S side, the second switch 212 is in the off state to cut off a current flowing from the second battery 3 side.

Here, the power supply control system 210 includes the housing 217 that houses the first switch 211, the second switch 212, the DC/DC converter 6, the third wiring H3, and the fifth wiring H5. The housing 217 is insulated from a body ground. Accordingly, insulation of the first switch 211, the second switch 212, the DC/DC converter 6, the third wiring H3, and the fifth wiring H5 against the body ground is strengthened, and a ground fault is prevented from occurring between the first switch 211 as well as the second switch 212 and the DC/DC converter 6.

The DC/DC converter 6 includes a switch (not shown) therein. When the control apparatus 220 sets the switch of the DC/DC converter 6 in the off state, an output of the DC/DC converter 6 is turned off, and a current that flows from a first switch 211 side and a second switch 212 side to the DC/DC converter 6 side is cut off. It is preferable that the DC/DC converter 6 has a function of protecting the DC/DC converter 6 from a short-circuit failure that occurs therein.

The control apparatus 220 includes a driver (not shown) and an MPU (not shown). The driver is a gate drive circuit including a resistor, a capacitor, and the like, and switches a gate drive voltage applied to the first switch 211 and the second switch 212 to a voltage that can be set in the forced on state or a voltage that can be set in the on state and the off state in response to a control signal output from the MPU.

The MPU outputs, to the driver, a control signal for switching the forced on state/on or off state of the first switch 211 and the second switch 212 in accordance with an on/off instruction from an in-vehicle ECU (not shown). Further, the MPU executes control for switching on/off of the first relay 14, the second relay 15, and the switch of the DC/DC converter 6.

Figure 8:
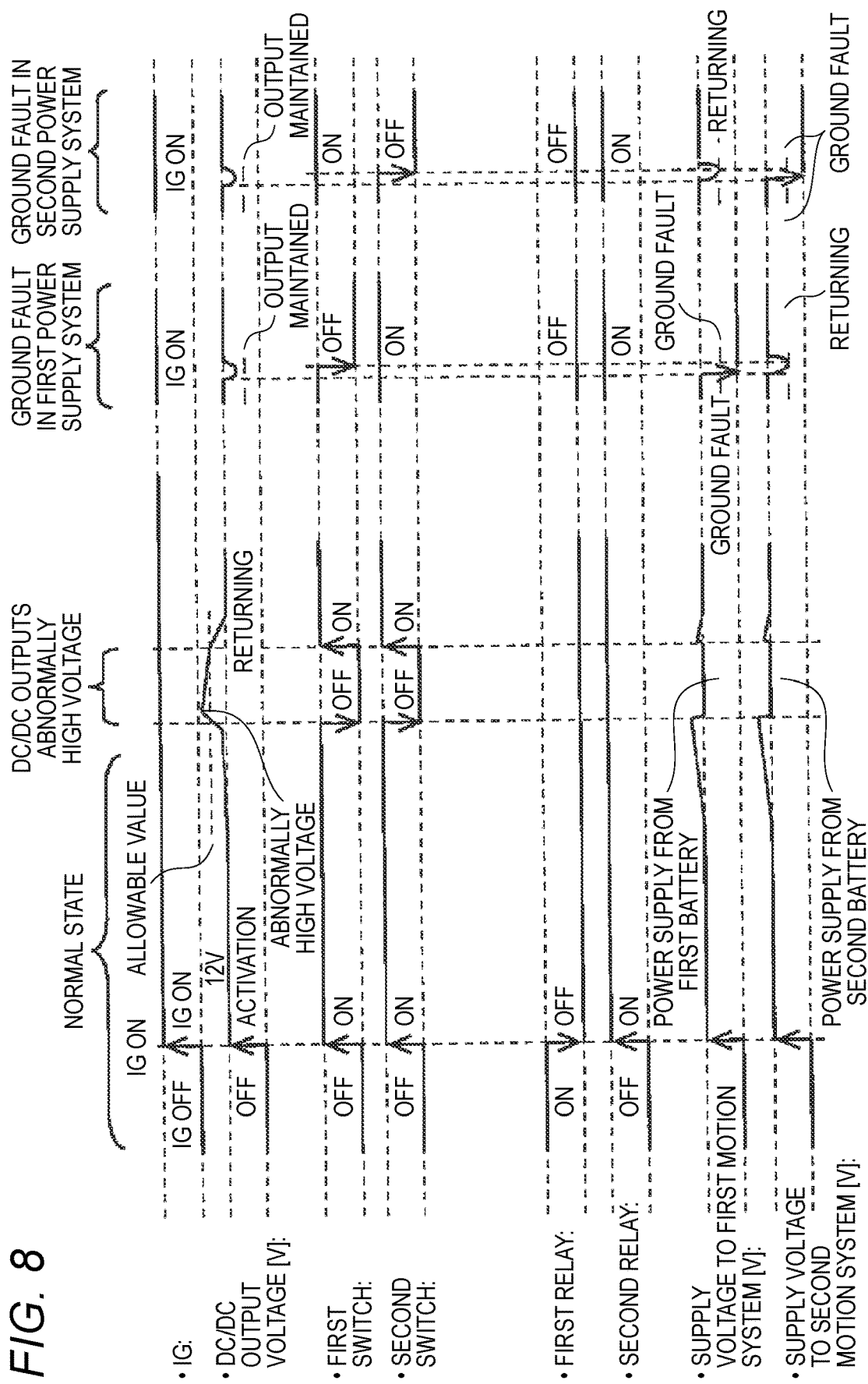
FIG. 8 is a timing chart showing a processing of the power supply control system shown in FIG. 7.
Figure 9:
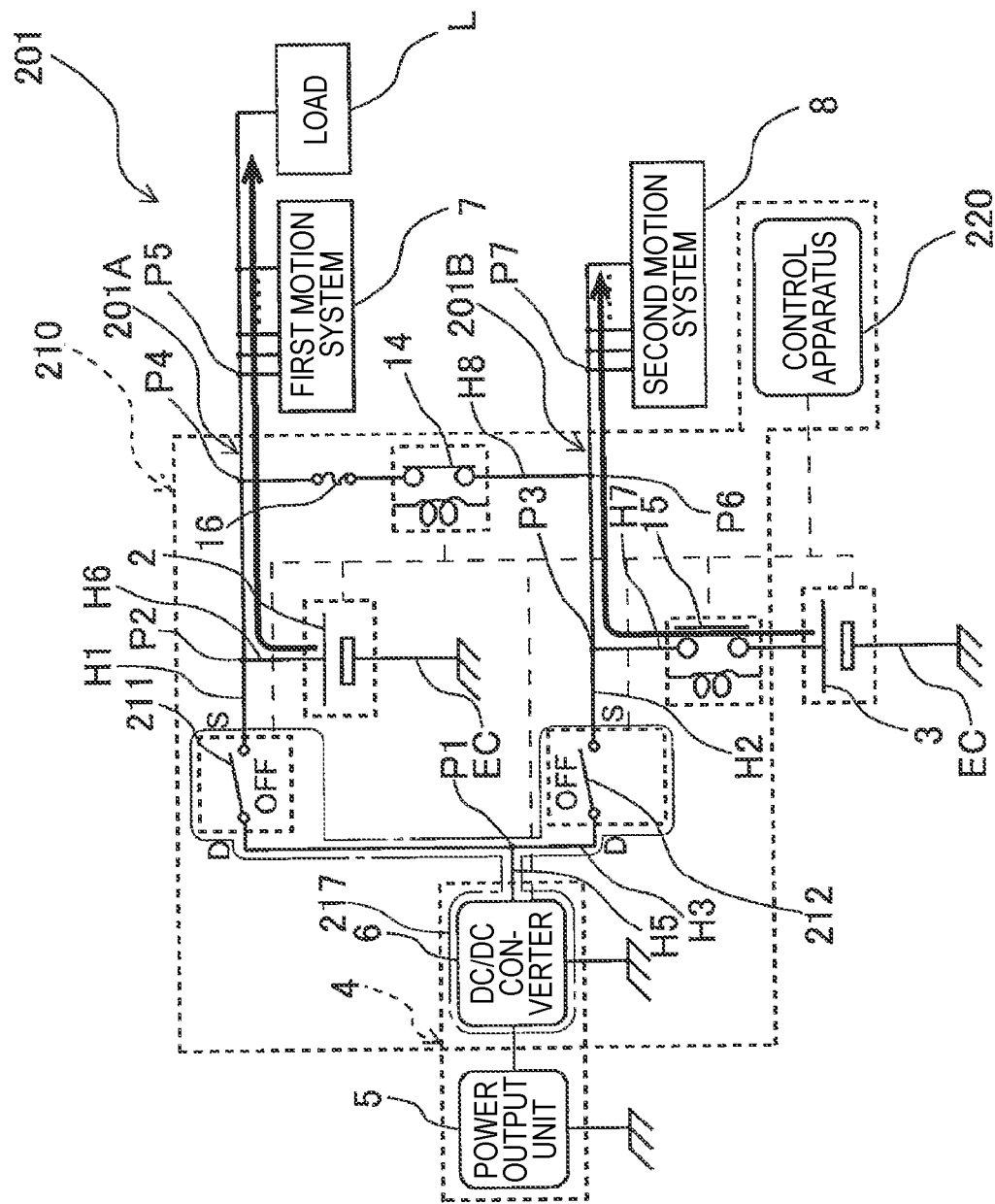
FIG. 9 is a diagram showing functions of the power supply control system shown in FIG. 7.
Figure 10:
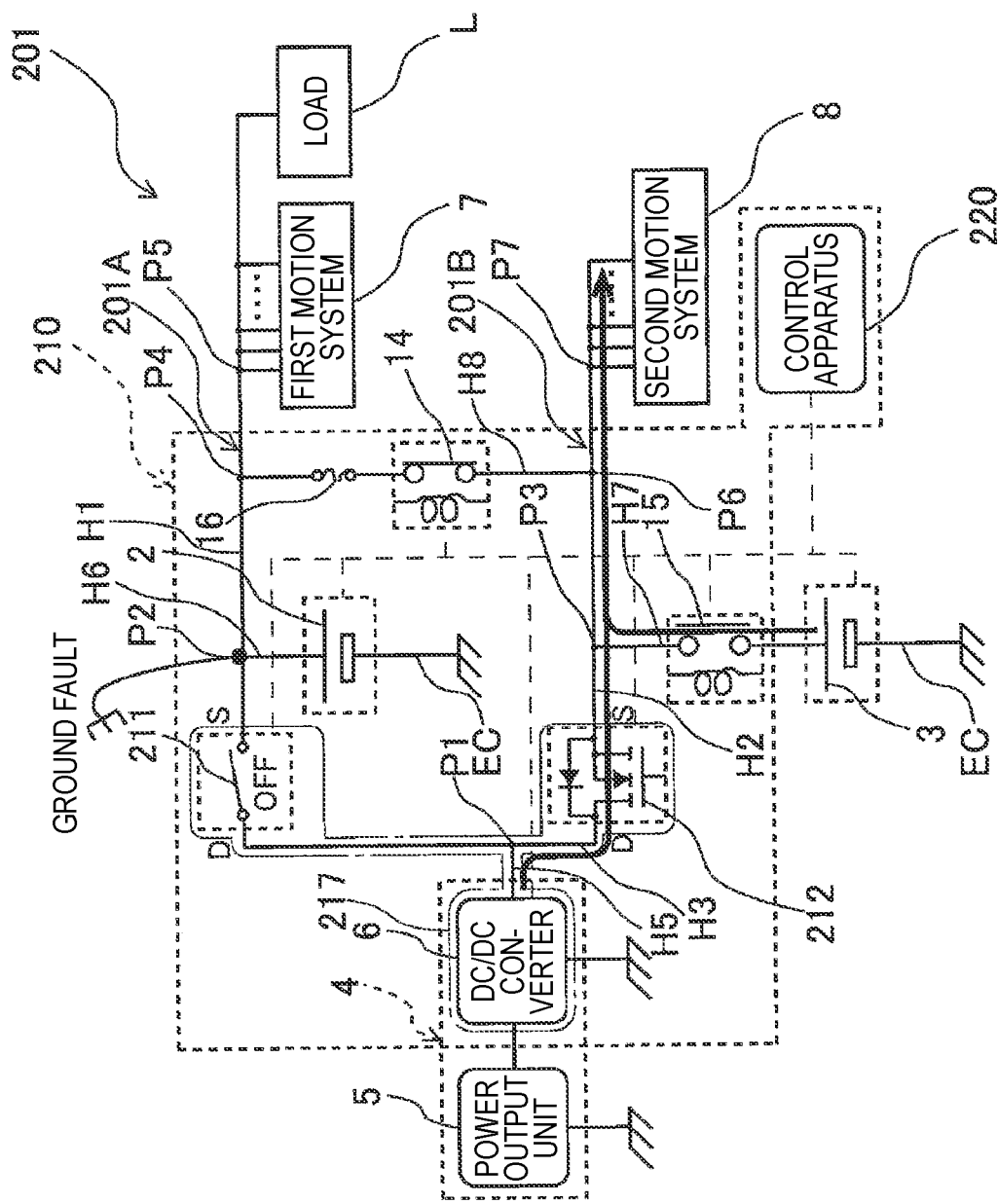
FIG. 10 is a diagram showing functions of the power supply control system shown in FIG. 7.
Figure 11:
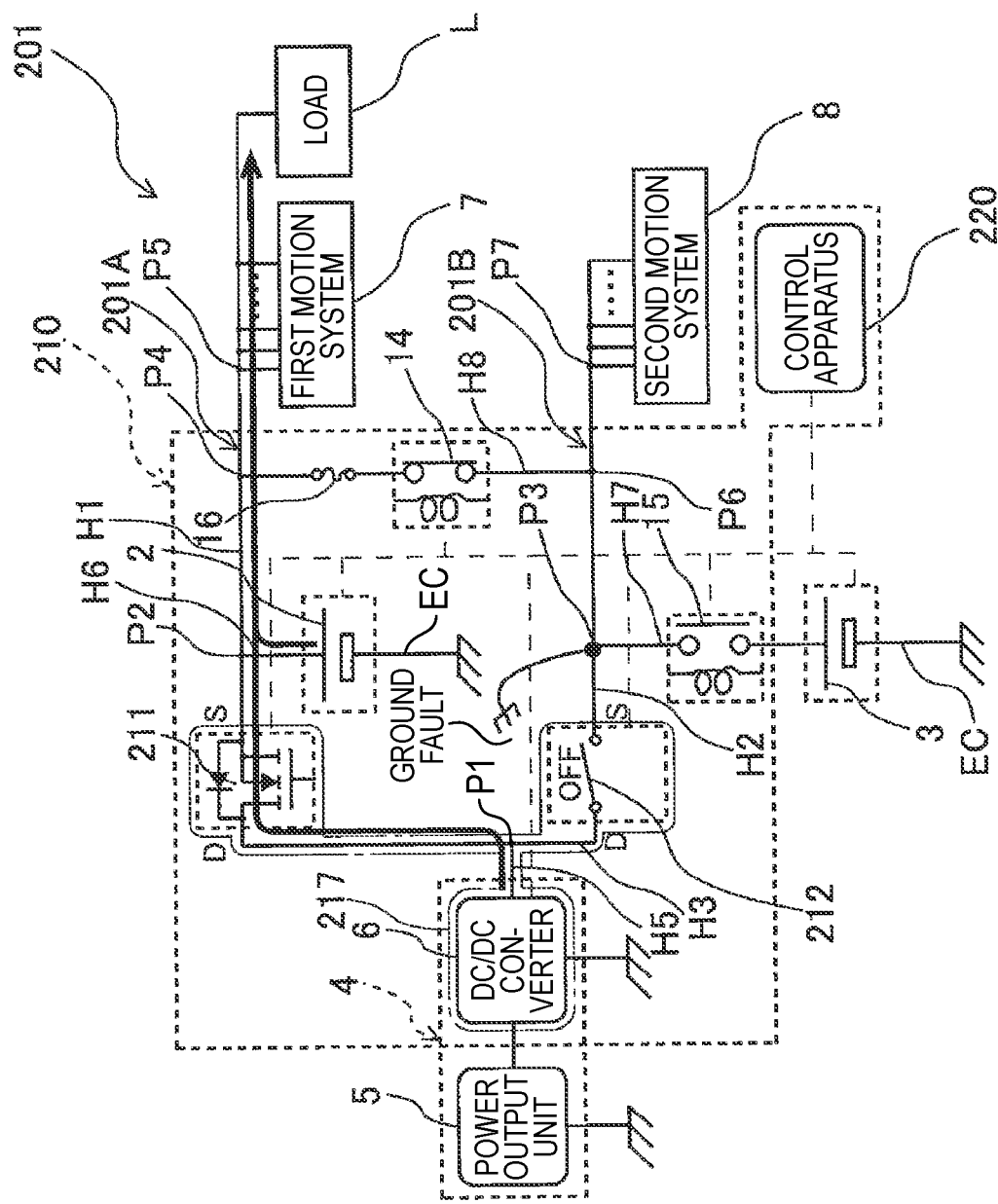
FIG. 11 is a diagram showing functions of the power supply control system shown in FIG. 7.

FIG. 8 is a timing chart showing a processing of the power supply control system 210 shown in FIG. 7. Further, FIGS. 9 to 11 are diagrams showing functions of the power supply control system 210 shown in FIG. 7. As shown in the timing chart of FIG. 8, when ignition (IG) is turned off, the output of the DC/DC converter 6 is turned off, the first switch 211 and the second switch 212 are in the off state, the first relay 14 is in the on state, and the second relay 15 is in the off state. When the ignition is turned off, the first switch 211 and the second switch 212 in the off state cut off a current flowing from the DC/DC converter 6 side, and the second relay 15 cuts off a current flowing from the second battery 3 side. Accordingly, when the ignition is turned off, a dark current is supplied from the first battery 2 to the first motion system 7, the load L, and the second motion system 8, but the dark current is not supplied from the second battery 3 to the first motion system 7, the load L, and the second motion system 8.

When the ignition is turned on, the output of the DC/DC converter 6 increases to a predetermined value (for example, 12V of a nominal voltage), the first switch 211 and the second switch 212 are in the forced on state, the first relay 14 is in the off state, and the second relay 15 is in the on state. When the ignition is turned on, the first switch 211 and the second switch 212 in the forced on state allow a current to flow in both directions as long as there is no voltage drop due to a ground fault or the like. Accordingly, when the ignition is turned on, the first battery 2 and the second battery 3 are charged by a power supply from the DC/DC converter 6, power is supplied from the DC/DC converter 6 or the first battery 2 to the first motion system 7 and the load L, and power is supplied from the DC/DC converter 6 or the second battery 3 to the second motion system 8. Normally, a state after the ignition is turned on is maintained.

The control apparatus 220 detects a voltage between the first switch 211 as well as the second switch 212 and the DC/DC converter 6. When the voltage becomes an abnormally high voltage that exceeds an allowable value, the control apparatus 220 sets the first switch 211 and the second switch 212 in the off state. Accordingly, the first switch 211 and the second switch 212 in the off state cut off a current flowing from the drain D to the source S that is, a current flowing from the DC/DC converter 6 side. Accordingly, as shown in FIG. 9, power of a nominal 12V is supplied from the first battery 2 to the first motion system 7 and the load L, and the power of the nominal 12V is supplied from the second battery 3 to the second motion system 8.

As shown in the timing chart of FIG. 8, when a ground fault occurs in the first power supply system 201A, a voltage of the first power supply system 201A decreases to or below a predetermined value (for example, 6V) lower than the nominal 12V. When the voltage of the first power supply system 201A decreases to or below the predetermined value lower than the nominal voltage 12V, the control apparatus 220 sets the first switch 211 in the off state. The first switch 211 in the off state cuts off a current flowing from the drain D to the source S, that is, a current flowing from the DC/DC converter 6 side. Here, since the first relay 14 is in the off state, the second power supply system 201B is disconnected from the first power supply system 201A where the ground fault occurs. Accordingly, as shown in FIG. 10, a power supply from the DC/DC converter 6 or the first battery 2 to the first motion system 7 is stopped, and a power supply from the DC/DC converter 6 or the second battery 3 to the second motion system 8 is started, so that the second motion system 8 operates normally.

Instead of detecting the ground fault that occurs in the first power supply system 201A in accordance with a voltage of the first power supply system 201A, the ground fault that occurs in the first power supply system 201A may be detected in accordance with a current value of a current that flows from the second battery 3 to the first switch 211 and the second switch 212. When the ground fault occurs in the first power supply system 201A, an excessive current flows from the second battery 3 to the first switch 211 and the second switch 212. Therefore, when an excessive current value that exceeds an allowable value is detected, the first switch 211 may be in the off state.

As shown in the timing chart of FIG. 8, when a ground fault occurs in the second power supply system 201B, a voltage of the second power supply system 201B decreases to or below a predetermined value (fir example, 6V) lower than the nominal 12V When the voltage of the second power supply system 201B decreases to or below the predetermined value lower than the nominal voltage 12V, the control apparatus 220 sets the second switch 212 in the off state. The second switch 212 in the off state cuts off a current flowing from the drain D to the source S, that is, a current flowing from the DC/DC converter 6 side. Here, since the first relay 14 is in the off state, the first power supply system 201A is disconnected from the second power supply system 201B where the ground fault occurs. Accordingly, as shown in FIG. 11, a power supply from the DC/DC converter 6 or the second battery 3 to the second motion system 8 is stopped, and a power supply from the DC/DC converter 6 or the first battery 2 to the first motion system 7 and the load L is started, so that the first motion system 7 and the load L operate normally.

Instead of detecting the ground fault that occurs in the second power supply system 1B in accordance with a voltage of the second power supply system 1B, the ground fault that occurs in the second power supply system 1B may be detected in accordance with a current value of a current that flows from the first battery 2 to the first switch 211 and the second switch 212. When a ground fault occurs in the second power supply system 201B, an excessive current flows from the first battery 2 to the first switch 211 and the second switch 212. Therefore, when an excessive current value that exceeds an allowable value is detected, the second switch 212 may be in the off state.

As described above, according to the power supply control system 210 of the present embodiment, in the redundant power supply system 201 in which power is supplied from one DC/DC converter 6 to the first power supply system 201A and the second power supply system 201B, even when a failure such as a ground fault occurs in any one of the first power supply system 1A and the second power supply system 1B, the other power supply system can be operated normally. Further, when an output voltage of the DC/DC converter 6 abnormally increases, power is supplied from the first battery 2 to the first motion system 7 and the load L, and power is supplied from the second battery 3 to the second motion system 8, so that the first power supply system 1A and the second power supply system 1B can be operated normally. Therefore, by providing one DC/DC converter 6 and omitting the third switch 13 of the above-described embodiment, the redundant power supply system 201 can be reduced in a size and a weight, and redundancy of a plurality of power supplies can be secured.

Since insulation against the body ground between the first switch 211 as well as the second switch 212 and the DC/DC converter 6 is strengthened, occurrence of a failure such as a ground fault between the first switch 211 as well as the second switch 212 and the DC/DC converter 6 can be prevented, the third switch 13 of the above-described embodiment can be omitted, and then redundancy of the plurality of power supplies can be secured.

Although the present invention has been described above based on the embodiments, the present invention is not limited to the above-described embodiments, and the above-described embodiments may be modified, or known or well-known technologies may be combined as appropriate, as long as the gist of the present invention does not deviate.

For example, in the above-described embodiments, the first to third switches 11, 12, 13, 211, and 212, which are MOSFETs, are N-channel MOSFETs, but the first to third switches 11, 12, 13, 211, and 212 may be P-channel MOSFETs. In this case, a positional relationship between the source S and the drain D may be reversed from those of the above-described embodiments.

Further, in the above-described embodiments, the high-voltage power output unit 5 and the DC/DC converter 6 are provided as the power supply unit 4, but for example, an alternator may be provided as the power output unit 5, and a voltage conversion unit that steps down high-voltage power such as a DC/DC converter may not be provided.

Here, the features of the embodiment of the power supply control system according to the present disclosure described above will be briefly summarized and listed in the following [1] to [7].

[1] A power supply control system configured to control a redundant power supply system that includes a first power supply system (1A, 201A) and a second power supply system (1B, 201B) connected in parallel to a power supply unit (4), the first power supply system (1A, 201A) including a first power supply (2) and a first system (7) to which power is supplied from the first power supply (2), the second power supply system (1B, 201B) including a second power supply (3) and a second system (8) to which power is supplied from the second power supply (3), the power supply control system including:

a first switch (11,211) that is a MOSFET provided between the power supply unit (4) and the first power supply (2);

a second switch (12, 212) that is a MOSFET provided between the power supply unit (4) and the second power supply (3);

a wiring (H8) configured to supply a dark current flowing from the first power supply (2) to the second system (8);

a first relay (14, 114) of a normally-on type provided on the wiring (H8); and a second relay (15) of a normally-off type provided between the second power supply (3) and the second switch (12, 212).

[2] The power supply control system according to the above 11, further including:

a third switch (13, 213) that is a MOSFET, the third switch (13, 213) being provided between the first switch (11,211) and the power supply unit (4) and between the second switch (12, 212) and the power supply unit (4), the third switch (13, 213) being configured to cut off a current flowing from a side of the power supply unit (4) to both a side of the first power supply system (1A, 201A) and a side of the second power supply system (1B, 201B) in an off state of the third switch (13, 213);

in which the first switch (11,211) cuts off a current flowing from a side of the first power supply system (1A, 201A) to a side of the power supply unit (4) in an off state of the first switch (11,211); and in which the second switch (12, 212) cuts off a current flowing from a side of the second power supply system (1B, 201B) to a side of the power supply unit (4) in an off state of the second switch (12, 212).

[3] The power supply control system according to the above [2], in which the first switch (11,211), the second switch (12, 212), and the third switch (13, 213) are N-channel MOSFETs; and in which a source of the first switch (11,211), a source of the second switch (12, 212), and a source of the third switch (13, 213) are connected to each other, a drain of the first switch (11,211) is connected to the first power supply (2) and the first system (7), a drain of the second switch (12, 212) is connected to the second power supply (3) and the second system (8), and a drain of the third switch (13, 213) is connected to the power supply unit (4).

[4] The power supply control system according to the above [2] or [3], further including:

a control unit (220) configured to control the first switch (211) and the second switch (212), in which when a voltage of the first power supply system (201A) is lower than a predetermined value or a current value of a current that flows from the second power supply (3) to the second switch (212) and the first switch (211) is larger than a predetermined value, the control unit (220) sets the second switch (212) in an off state; and in which when a voltage of the second power supply system (201B) is lower than a predetermined value or a current value of a current that flows from the first power supply (2) to the first switch (211) and the second switch (212) is larger than a predetermined value, the control unit (220) sets the first switch (211) in an off state.

[5] The power supply control system according to the above [4], in which when an output voltage of the power supply unit (4) is higher than a predetermined value, the control unit (220) sets the third switch (213) in an off state.

[6] The power supply control system according to the above [1], in which the power supply unit (4) includes a power output unit (5), and a voltage conversion unit (6) including a unit that steps down power output from the power output unit (5) to output the stepped-down power to the first switch (211) and the second switch (212), and that cuts off a current flowing from a side of the first switch (211) and a side of the second switch (212);

in which the first switch (211) cuts off a current flowing from a side of the power supply unit (4) to a side of the first power supply system (201A) in an off state of the first switch (211); and in which the second switch (212) cuts off a current flowing from a side of the power supply unit (4) to a side of the second power supply system (201B) in an off state of the second switch (212), the power supply control system further including:

a housing configured to house the voltage conversion unit (6), the first switch (211), the second switch (212), and a wiring (H8) connecting the voltage conversion unit (6), the first switch (211), and the second switch (212).

[7] The power supply control system according to the above 161, further including:

a control unit (220) configured to control the first switch (211) and the second switch (212), in which when a voltage of the first power supply system (201A) is lower than a predetermined value or a current value of a current that flows from the second power supply (3) to both the second switch (212) and the first switch (211) is larger than a predetermined value, the control unit (220) sets the first switch (211) in an off state; and in which when a voltage of the second power supply system (201B) is lower than a predetermined value or a current value of a current that flows from the first power supply (2) to both the first switch (211) and the second switch (212) is larger than a predetermined value, the control unit (220) sets the second switch (212) in an off state

What is claimed is:

1. A power supply control system configured to control a redundant power supply system that includes a first power supply system and a second power supply system connected in parallel to a power supply unit, the first power supply system including a first power supply and a first system to which power is supplied from the first power supply, the second power supply system including a second power supply and a second system to which power is supplied from the second power supply, the power supply control system comprising:
    a first switch that is a MOSFET provided between the power supply unit and the first power supply;
    a second switch that is a MOSFET provided between the power supply unit and the second power supply;
    a wiring configured to supply a dark current flowing from the first power supply to the second system;
    a first relay of a normally-on type provided on the wiring;
    a second relay of a normally-off type provided between the second power supply and the second switch;
    a third switch that is a MOSFET, the third switch being provided between the first switch and the power supply unit and between the second switch and the power supply unit, the third switch being configured to cut off a current flowing from a side of the power supply unit to both a side of the first power supply system and a side of the second power supply system in an off state of the third switch;
    wherein the first switch cuts off a current flowing from a side of the first power supply system to a side of the power supply unit in an off state of the first switch; and
    wherein the second switch cuts off a current flowing from a side of the second power supply system to a side of the power supply unit in an off state of the second switch.

2. The power supply control system according to claim 1, wherein the first switch, the second switch, and the third switch are N-channel MOSFETs; and wherein a source of the first switch, a source of the second switch, and a source of the third switch are connected to each other, a drain of the first switch is connected to the first power supply and the first system, a drain of the second switch is connected to the second power supply and the second system, and a drain of the third switch is connected to the power supply unit.

3. The power supply control system according to claim 1, further comprising: a control unit configured to control the first switch and the second switch, wherein when a voltage of the first power supply system is lower than a predetermined value or a current value of a current that flows from the second power supply to the second switch and the first switch is larger than a predetermined value, the control unit sets the second switch in an off state; and wherein when a voltage of the second power supply system is lower than a predetermined value or a current value of a current that flows from the first power supply to the first switch and the second switch is larger than a predetermined value, the control unit sets the first switch in an off state.

4. The power supply control system according to claim 3, wherein when an output voltage of the power supply unit is higher than a predetermined value, the control unit sets the third switch in an off state.

5. A power supply control system configured to control a redundant power supply system that includes a first power supply system and a second power supply system connected in parallel to a power supply unit, the first power supply system including a first power supply and a first system to which power is supplied from the first power supply, the second power supply system including a second power supply and a second system to which power is supplied from the second power supply, the power supply control system comprising:
    a first switch that is a MOSFET provided between the power supply unit and the first power supply;
    a second switch that is a MOSFET provided between the power supply unit and the second power supply;
    a wiring configured to supply a dark current flowing from the first power supply to the second system;
    a first relay of a normally-on type provided on the wiring; and
    a second relay of a normally-off type provided between the second power supply and the second switch,
    wherein the power supply unit includes a power output unit, and a voltage conversion unit including a unit that steps down power output from the power output unit to output the stepped-down power to the first switch and the second switch, and that cuts off a current flowing from a side of the first switch and a side of the second switch;
    wherein the first switch cuts off a current flowing from a side of the power supply unit to a side of the first power supply system in an off state of the first switch; and
    wherein the second switch cuts off a current flowing from a side of the power supply unit to a side of the second power supply system in an off state of the second switch,
    the power supply control system further comprising:
    a housing configured to house the voltage conversion unit, the first switch, the second switch, and a wiring connecting the voltage conversion unit, the first switch, and the second switch.

6. The power supply control system according to claim 5, further comprising:
   a control unit configured to control the first switch and the second switch,
   wherein when a voltage of the first power supply system is lower than a predetermined value or a current value of a current that flows from the second power supply to both the second switch and the first switch is larger than a predetermined value, the control unit sets the first switch in an off state; and
   wherein when a voltage of the second power supply system is lower than a predetermined value or a current value of a current that flows from the first power supply to both the first switch and the second switch is larger than a predetermined value, the control unit sets the second switch in an off state.

* * * * *